United States Patent
Hong et al.

(10) Patent No.: US 10,756,746 B2
(45) Date of Patent: Aug. 25, 2020

(54) ANALOG DIGITAL CONVERTER, INTEGRATED CIRCUIT, AND SENSOR SYSTEM

(71) Applicant: SAMSUNG ELECTRONICS CO., LTD., Suwon-si (KR)

(72) Inventors: Hyeokki Hong, Suwon-si (KR); Cheheung Kim, Yongin-si (KR); Sungchan Kang, Hwaseong-si (KR); Yongseop Yoon, Seoul (KR); Choongho Rhee, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/433,046

(22) Filed: Jun. 6, 2019

(65) Prior Publication Data
US 2020/0204187 A1    Jun. 25, 2020

(30) Foreign Application Priority Data
Dec. 20, 2018    (KR) .................. 10-2018-0166411

(51) Int. Cl.
*H03M 1/38* (2006.01)
*H03M 1/56* (2006.01)
*H03M 1/66* (2006.01)

(52) U.S. Cl.
CPC .............. *H03M 1/38* (2013.01); *H03M 1/56* (2013.01); *H03M 1/66* (2013.01)

(58) Field of Classification Search
CPC ............. H03M 1/38; H03M 1/56; H03M 1/66
USPC ................................................ 341/155, 161
See application file for complete search history.

(56) References Cited

U.S. PATENT DOCUMENTS

| | | | |
|---|---|---|---|
| 5,856,722 A | 1/1999 | Haronian et al. | |
| 7,315,157 B2 * | 1/2008 | Chapuis | H02M 3/157 323/282 |
| 7,863,714 B2 | 1/2011 | Diamond et al. | |
| 8,103,027 B2 | 1/2012 | Zhang et al. | |
| 8,170,244 B2 | 5/2012 | Ryan et al. | |
| 8,289,011 B2 * | 10/2012 | Vigelius | H02M 3/156 323/283 |
| 8,310,220 B2 * | 11/2012 | Takahashi | H02M 1/36 323/283 |
| 8,836,350 B2 | 9/2014 | Peter | |

(Continued)

FOREIGN PATENT DOCUMENTS

| | | |
|---|---|---|
| JP | 5659950 B2 | 1/2015 |
| KR | 10-2015-0010867 A | 1/2015 |
| KR | 10-1667978 B1 | 10/2016 |

OTHER PUBLICATIONS

Cisco, "Securing the Internat of Things: A Proposed Framework", https://www.cisco.com/c/en/us/about/security-center/secure-iot-proposed-framework.html, downloaded Sep. 10, 2019. (8 pages total).

(Continued)

*Primary Examiner* — Brian K Young
(74) *Attorney, Agent, or Firm* — Sughrue Mion, PLLC

(57) ABSTRACT

Provided is an integrated circuit including an analog-to-digital converter (ADC) configured to convert an analog signal to a digital signal; and a digital signal processor (DSP) configured to process the digital signal, wherein the ADC generates a power source during a process for converting the analog signal into the digital signal and supplies power to the DSP through the power source.

28 Claims, 11 Drawing Sheets

(56) References Cited

U.S. PATENT DOCUMENTS

| | | |
|---|---|---|
| 9,148,159 B1 | 9/2015 | Sharma et al. |
| 9,214,949 B1 * | 12/2015 | Wu .......................... H02M 3/07 |
| 2013/0076553 A1 | 3/2013 | Kuo et al. |
| 2014/0253223 A1 | 9/2014 | Meehan et al. |
| 2016/0050506 A1 | 2/2016 | Kim |
| 2018/0100925 A1 | 4/2018 | Gilliland et al. |

OTHER PUBLICATIONS

Communication dated Feb. 10, 2020, from the European Patent Office in counterpart European Application No. 19183950.5.
Sagib Qayyum Malik "Sampled charge reuse for power reduction in switched capacitor data converters" Iowa State University, Retrospective Theses and Dissertations, Jan. 2, 2006, (85 pages total) XP055319000.

* cited by examiner

ANALOG DIGITAL CONVERTER, INTEGRATED CIRCUIT, AND SENSOR SYSTEM

CROSS-REFERENCE TO RELATED APPLICATION

This application is based on and claims priority from Korean Patent Application No. 10-2018-0166411, filed on Dec. 20, 2018, in the Korean Intellectual Property Office, the disclosure of which is incorporated herein in its entirety by reference.

BACKGROUND

1. Field

The disclosure relates to an analog-to-digital converter (ADC), an integrated circuit, and a sensor system.

2. Description of the Related Art

An analog circuit, such as an ADC in an integrated circuit requires a relatively large supply power in order to increase a signal to noise ratio (SNR). On the other hand, a digital circuit, such as a digital signal processor (DSP) may require a relatively low supply power to reduce power consumption. However, a power source device such as a power management integrated circuit (PMIC) is required to supply different sizes of power to an analog circuit and a digital circuit within an integrated circuit, and thus there may be problems such as loss of power due to voltage conversion in the PMIC or increase of area due to an external inductor or capacitors used by the PMIC. Therefore, a method of more efficiently supplying power suitable for each of an analog circuit and a digital circuit within an integrated circuit is needed.

SUMMARY

Provided are an analog-to-digital converter (ADC), an integrated circuit, and a sensor system.

Additional aspects will be set forth in part in the description which follows and, in part, will be apparent from the description, or may be learned by practice of the presented embodiments.

According to an aspect of the disclosure, there is provided an integrated circuit comprising: a digital signal processor (DSP) configured to process a digital signal; and an analog-to-digital converter (ADC) configured to: convert an analog signal to the digital signal; generate a power source during a process of converting the analog signal into the digital signal; and supply power to the DSP based on the power source.

The ADC may be further configured to generate the power source by charging a power source capacitor during the process of converting the analog signal into the digital signal.

The ADC may be further configured to: determine bits of the digital signal by switching a voltage connected to at least one capacitor from among a plurality of capacitors from a first reference voltage to a second reference voltage, perform multi-level switching of the at least one capacitor for switching the voltage from the first reference voltage to the second reference voltage through the power source capacitor, and generate the power source by charging a voltage to a power source capacitor through the multi-level switching.

The at least one capacitor may be different from a topmost capacitor from among the plurality of capacitors arranged in a sequence.

The ADC may be further configured to control the multi-level switching according to a magnitude of a voltage of the power source capacitor and adjust an amount of power supplied to the DSP.

The ADC may be further configured to convert the analog signal to the digital signal based on power supplied from an external power source, and the DSP may be further configured to process the digital signal based on power supplied from the power source generated by the ADC without receiving power from the external power source.

According to another aspect of the disclosure, there is provided an analog-to-digital converter (ADC) for converting an analog signal to a digital signal, the ADC comprising: a plurality of capacitors; a plurality of switches; and successive approximation register (SAR) logic configured to: sample the analog signal by connecting the analog signal to the plurality of capacitors; float at least one capacitor comprising a topmost capacitor from among the plurality of capacitors arranged in a sequence, to determine a most significant bit (MSB) of the digital signal; switch voltages connected to the plurality of capacitors through the plurality of switches and determine bits other than the MSB of the digital signal.

The SAR logic may be further configured to determine the MSB of the digital signal by floating the at least one capacitor and connect a first reference voltage or a second reference voltage to one or more capacitors other than the at least one capacitor from among the plurality of capacitors.

The SAR logic may be further configured to determine the MSB of the digital signal by floating the at least one capacitor and connect an intermediate voltage to one or more capacitors other than the at least one capacitor from among the plurality of capacitors, the intermediate voltage having a voltage value between the first reference voltage and the second reference voltage.

The ADC may further comprise a power source capacitor, wherein, when a voltage connected to at least one capacitor from among the plurality of capacitors is switched from the first reference voltage to the second reference voltage, the SAR logic may be further configured to perform multi-level switching for switching the voltage from the first reference voltage to the second reference voltage through the power source capacitor.

The SAR logic may be further configured to generate a power source by charging a voltage to the power source capacitor through the multi-level switching and supply power to a digital signal processor (DSP) through the power source.

The ADC may further comprise a power source status detector configured to determine whether the voltage of the power source capacitor is higher than or equal to a threshold value or is below the threshold value, wherein the SAR logic may be further configured to control the multi-level switching according to a result of the determination and adjust an amount of power supplied to the DSP.

The SAR logic may be further configured to detect a change in an output signal of a comparator according to a clock signal designating an operable time region and generate a control signal for controlling the plurality of switches based on the detected change in the output signal of the comparator.

According to another aspect of the disclosure, there is provided a sensor system comprising: a sensor; an external power source; a digital signal processor (DSP) configured to process the digital signal; an analog-to-digital converter (ADC) configured to: convert an analog signal detected by the sensor into the digital signal based on a power supplied from the external power source; generate an internal power source during a process of converting the analog signal into the digital signal, and supply power to the DSP based on the internal power source.

The ADC may be further configured to receive power from an external power source, and the DSP may be further configured to process the digital signal based on power supplied from the internal power source generated by the ADC without receiving power from the external power source.

The DSP may be further configured to receive power from the external power source and process the digital signal based on power supplied from the ADC and the external power source.

The ADC may be further configured to receive power from the sensor and convert the analog signal to the digital signal based on the power supplied from the sensor and the power supplied from the external power source.

The DSP may be further configured to receive power from the sensor and process the digital signal based on the power supplied from the ADC and the power supplied from the sensor.

According to another aspect of the disclosure, there is provided an analog-to-digital converter (ADC) comprising: a plurality of sampling capacitors; a plurality of multi-level switches, each comprising a first end connected one of the plurality of sampling capacitors; a power capacitor; and a processor configured to convert an input analog signal to a digital signal by selectively switching each of the plurality of multi-level switches to connect the plurality of sampling capacitors to one of a first reference voltage, a second reference voltage or the power capacitor, wherein the power capacitor may be charged with a voltage from a first capacitor from among the plurality of sampling capacitors when the processor controls a first multi-level switch to switch from the first reference voltage to the second reference voltage.

The processor may be further configured to control the multi-level switch to switch from the first reference voltage to the second reference voltage via the power capacitor.

The processor may be further configured to control the multi-level switch to switch from the first reference voltage to the power capacitor before switching to the second reference voltage.

The processor may be further configured to selectively switch each of the plurality of multi-level switches based on a voltage value of the power capacitor.

According to another aspect of the disclosure, there is provided a method of converting an analog signal to a digital signal by an analog-to-digital converter (ADC) comprising a plurality of sampling capacitors, a plurality of multi-level switches, each comprising a first end connected one of the plurality of sampling capacitors and a power capacitor, the method comprising: converting an input analog signal to a digital signal by selectively switching each of the plurality of multi-level switches to connect the plurality of sampling capacitors to one of a first reference voltage, a second reference voltage or the second capacitor; and charging the power capacitor with a voltage from a first capacitor from among the plurality of sampling capacitors when a first multi-level switch is controlled to switch from the first reference voltage to the second reference voltage.

The method may comprise controlling the multi-level switch to switch from the first reference voltage to the second reference voltage via the power capacitor.

The method may comprise controlling the multi-level switch to switch from the first reference voltage to the power capacitor before switching to the second reference voltage.

The method may comprise selectively switching each of the plurality of multi-level switches based on a voltage value of the power capacitor.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
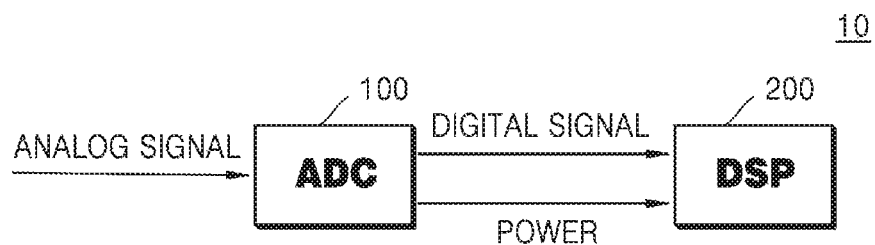
FIG. 1 is a diagram showing an integrated circuit according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Embodiments will now be described in detail with reference to the accompanying drawings. It is to be understood that the following embodiments are for the purpose of describing the technical contents, but do not limit or limit the scope of the rights. It will be understood that anything that one of ordinary skill in the art may easily deduce from the detailed description and embodiments falls within the scope of the disclosure.

In the specification, it is to be understood that the terms such as "including" or "having," etc., are intended to indicate the existence of the features, numbers, steps, operations, actions, components, parts, or combinations thereof disclosed in the specification, and are not intended to preclude the possibility that one or more other features, numbers, steps, actions, components, parts, or combinations thereof may exist or may be added. In addition, the terms "-er", "-or", and "module" described in the specification mean units for processing at least one function and operation and may be implemented by hardware components or software components and combinations thereof.

While such terms as "first," "second," etc., may be used to describe various components, such components must not be limited to the above terms. The above terms are used only to distinguish one component from another.

FIG. 1 is a diagram showing an integrated circuit according to an embodiment.

An integrated circuit 10 may include an analog-to-digital converter (ADC) 100 and a digital signal processor (DSP) 200. The integrated circuit 10 shown in FIG. 1 shows only components related to the embodiment. Therefore, it will be understood by one of ordinary skill in the art that general-purpose components other than the components shown in FIG. 1 may be further included. For example, the integrated circuit 10 may include a phase lock loop (PLL), a micro controller unit (MCU), a central processing unit (CPU), an application processor (AP), and a memory, but the disclosure is not limited thereto.

The ADC 100 may convert an analog signal to a digital signal. For example, the ADC 100 may be a successive approximation ADC, may quantize an analog signal input through a binary search, and may output a digital signal.

The ADC 100 may generate a power source during conversion of an analog signal to a digital signal and may supply power to the DSP 200 through the generated power source. The ADC 100 may convert an analog signal to a digital signal through power supplied from an external power source and generate a power source for supplying power to the DSP 200 during the conversion. In detail, the ADC 100 may generate a power source by charging a capacitor with a voltage during conversion of an analog signal to a digital signal.

The DSP 200 may process digital signals output from the ADC 100. The DSP 200 may process digital signals by using power supplied from the ADC 100. The DSP 200 may process digital signals by using only power supplied from the ADC 100 without receiving any power from an external power source.

Although relatively large supply power is needed to increase a signal-to-noise ratio (SNR) in an analog circuit such as the ADC 100 in the integrated circuit 10, relatively small supply power may be needed in a digital circuit such as the DSP 200, which to reduce power consumption. In particular, since the DSP 200 is a digital signal-based operation circuit that needs a low voltage for low power operation and is not influenced by fluctuations of voltage, the DSP 200 may be operated only by power supplied by the ADC 100. Therefore, since power to be supplied to the DSP 200 from an external power source is not needed, the integrated circuit 10 may be operated with low power, thus exhibiting low heat generation or longer expected lifespan.

Also, since the DSP 200 may be operated only with power supplied by the ADC 100 and does not need an external power source such as a power management integrated circuit (PMIC) for supplying power to the DSP 200, the integrated circuit 10 may be employed in micro devices. For example, the integrated circuit 10 may be employed in an Internet of Things (IoT) micro device such as a micro temperature sensor, a micro humidity sensor, or a micro distance sensor, may be employed in a micro wearable device such as a hearing aid or a retina display, or may be employed in an implantable sensor that senses brain waves or biological signals. However, the disclosure is not limited thereto.

Figure 2:
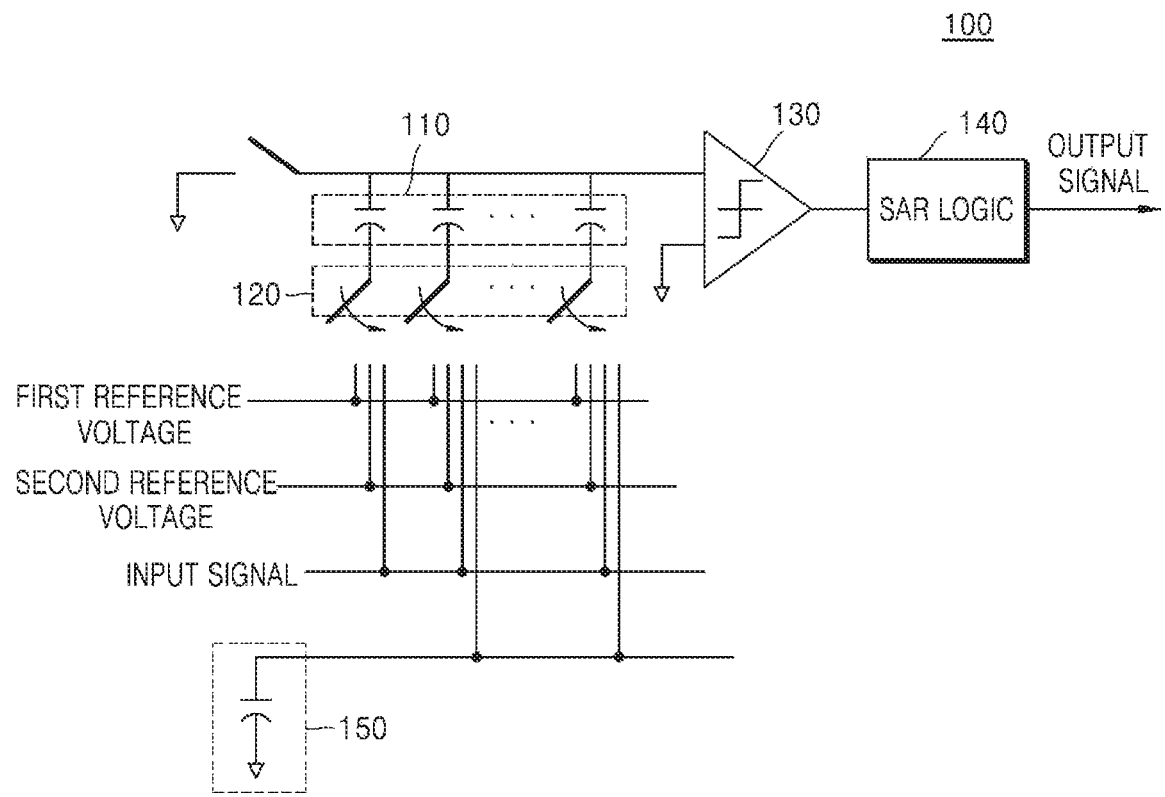
FIG. 2 is a diagram showing an analog-to-digital converter (ADC) according to an embodiment.

FIG. 2 is a diagram showing an analog-to-digital converter (ADC) according to an embodiment.

The ADC 100 is a successive approximation ADC (ADC) and may compare an analog signal, which is an input signal, with a refined reference voltage and sequentially determine bits of a digital signal from a most significant bit (MSB) to a least significant bit (LSB). The ADC 100 may include a plurality of capacitors 110, a plurality of switches 120, a comparator 130, a successive approximation register logic (SAR) logic 140, and a power source capacitor 150.

The SAR logic 140 may control the entire circuit in the ADC 100 and may determine bits of a digital signal by switching voltages connected to the plurality of capacitors 110 through the plurality of switches 120. In detail, the SAR logic 140 may sequentially switch voltages connected to the plurality of capacitors 110, thereby sequentially determining bits of a digital signal from the MSB to the LSB.

The SAR logic 140 may perform multi-level switching to switch voltages through the power source capacitor 150 in case of switching a voltage connected to at least one capacitor from among the plurality of capacitors via at least one switch from among the plurality of switches 120. In detail, when a voltage connected to at least one capacitor from among the plurality of capacitors 110 is switched from a first reference voltage to a second reference voltage, the SAR logic 140 may perform multi-level switching to switch the voltage from the first reference voltage to the second reference voltage via the power source capacitor 150.

For convenience of explanation, FIG. 2 shows that the power source capacitor 150 includes one capacitor, but the power source capacitor 150 may include two or more capacitors. For example, when the power source capacitor 150 includes two capacitors, the SAR logic 140 may perform multi-level switching to switch a voltage connected to at least one of the capacitors, such that the voltage passes successively through a first capacitor and a second capacitor in the power source capacitor 150.

Figure 3:
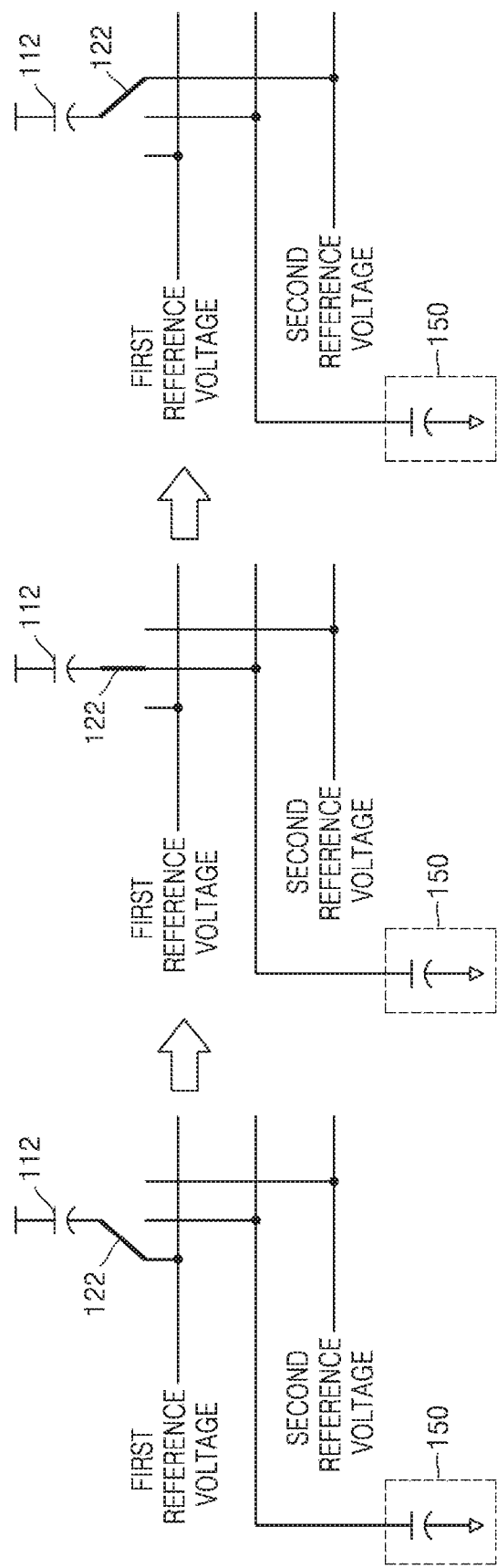
FIG. 3 is a diagram showing an embodiment in which an ADC controls multi-level switching.

FIG. 3 is a diagram showing an embodiment in which an ADC controls multi-level switching.

To determine an n-th bit of a digital signal, the ADC 100 may control a first switch 122 from among the plurality of switches 120 to switch a voltage connected to a first capacitor 112 from among the plurality of capacitors 110 from a first reference voltage to a second reference voltage. For example, the ADC 100 may switch the voltage connected to the first capacitor 112 from 0 [v] to 1 [v] or from 0 [v] to 1 [v]. In this case, as shown in FIG. 3, the ADC 100 may control the voltage connected to the first capacitor 112 to be switched through the power source capacitor 150 instead of being switched directly from the first reference voltage to the second reference voltage. In other words, the ADC 100 may control the first switch 122, such that one end of the first capacitor 112 is sequentially connected to the first reference voltage, one end of the power source capacitor 150, and the second reference voltage.

On the other hand, in case of switching the voltage connected to the first capacitor 112 from the second reference voltage to the first reference voltage, the ADC 100 may switch the voltage from the second reference voltage to the first reference voltage via the power source capacitor 150.

For convenience of explanation, FIG. 3 shows that the power source capacitor 150 includes one capacitor, but the disclosure is not limited thereto. For example, when the power source capacitor 150 includes a first capacitor and a second capacitor, the ADC 100 may control one or more switches, such that one end of the first capacitor 112 is sequentially connected to the first reference voltage, one end of the first capacitor of the power source capacitor 150, one end of the second capacitor of the power source capacitor 150, and the second reference voltage.

Referring back to FIG. 2, the SAR logic 140 may perform multi-level switching through at least one switch from among the plurality of switches 120 and charge the power source capacitor 150 with a voltage through the multi-level switching, thereby generating a power source capable of supplying power to an external device. In detail, during multi-level switching, at least one capacitor from among the plurality of capacitors 110 may be connected to the power source capacitor 150, and some of energy or voltage of the at least one capacitor from among the plurality of capacitors 110 may be stored in the power source capacitor 150.

Also, as a result of multi-level switching, loss energy due to switching may be reduced. In other words, loss energy due to multi-level switching through the power source capacitor 150 may be less than loss energy due to switching of a voltage connected to the plurality of capacitors 110 directly from a first reference voltage to a second reference voltage.

Figure 4A:
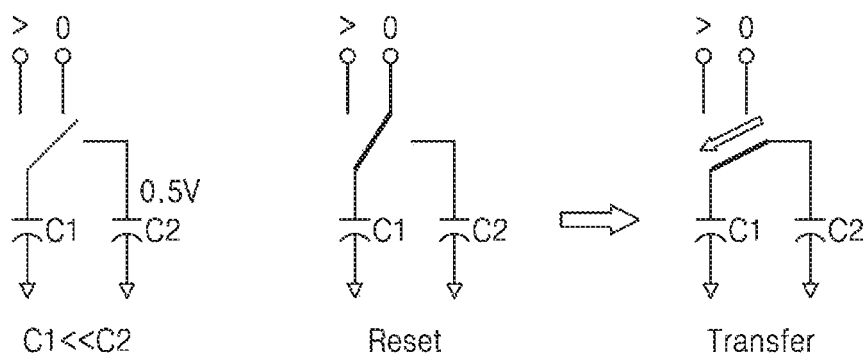
FIGS. 4A and 4B are diagrams showing loss energy and an energy transfer process according to multi-level switching.
Figure 4B:
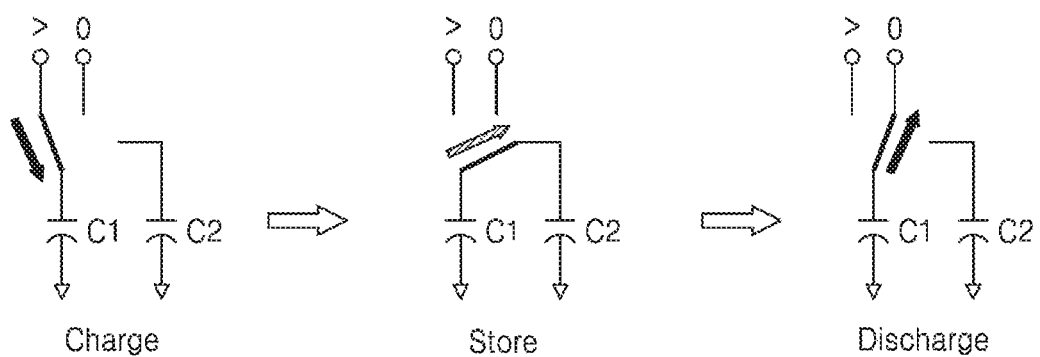

FIGS. 4A and 4B are diagrams showing loss energy and an energy transfer process according to multi-level switching.

In FIGS. 4A and 4B, for convenience of explanation, the plurality of capacitors 110 may be modeled as a C1 capacitor having a capacitance value C1, and the power source capacitor 150 may be modeled as a C2 capacitor having a capacitance value C2. Also, in FIG. 4, it is assumed that a first reference voltage is 0 [v], a second reference voltage is V [v], and the capacitance value C2 is greater than the capacitance value C1. It is also assumed that the C2 capacitor is charged to 0.5V [v] in advance. In other words, it is assumed that energy of 0.25 CV2 is stored in the C2 capacitor.

First, in a reset operation of FIG. 4A, the C1 capacitor may be connected to the first reference voltage, which is 0 [v].

Next, in a transfer operation of FIG. 4A, the C1 capacitor may be connected to the C2 capacitor. At this time, 0.125CV2, which is the half of the energy stored in the C2 capacitor in advance (that is, 0.25CV2), may be stored in the C1 capacitor, and the remaining 0.125CV2 may be consumed as loss energy due to switching.

Next, in a charge operation of FIG. 4B, the capacitor C1 may be connected to the second reference voltage, which is V [v]. At this time, 0.375CV2 of 0.5CV2, which is the energy supplied from the second reference voltage, may be stored in the C1 capacitor, and the remaining 0.125CV2 may be consumed as loss energy due to switching.

Next, in a storage stage of FIG. 4B, the C1 capacitor may be connected to the C2 capacitor. At this time, 0.25CV2 out of 0.375CV2, which is the pre-stored energy of the C2 capacitor, may be stored in the C2 capacitor, and the remaining 0.125CV2 may be consumed as loss energy due to switching.

Finally, in a discharge step of FIG. 4B, the C1 capacitor may be connected to the first reference voltage, that is 0 [v].

At this time, 0.125CV2, which is the pre-stored energy of the C1 capacitor, may be consumed as loss energy due to switching.

Therefore, the loss energy as a result of multi-level switching the voltage connected to the C1 capacitor, which models the plurality of capacitors 110, from the first reference voltage to the second reference voltage through the C2 capacitor is 0.25CV2, which is the half of the loss energy as a result of direct switching from the second reference voltage to the second reference voltage, which is 0.5CV2. Also, as a result of multi-level switching, the energy of 0.25CV2 may be stored in the C2 capacitor, which models the power source capacitor 150, power may be supplied to the outside by using the energy stored in the C2 capacitor.

Referring back to FIG. 2, the SAR logic 140 may determine bits of a digital signal based on an output signal of the comparator 130. Also, the SAR logic 140 may control the plurality of switches 120 to determine the other lower bits of the digital signal based on the output signal of the comparator 130. In detail, the SAR logic 140 may detect a change of the output signal of the comparator 130 according to a clock signal that designates an operable time region and generate a control signal for controlling the plurality of switches 120.

According to another embodiment, an analog-to-digital converter (ADC) may include a plurality of sampling capacitors, a plurality of multi-level switches, a power capacitor and a processor. Each of the plurality of multi-level switches may comprise a first end connected one of the plurality of sampling capacitors. According to an embodiment, the processor may be a hardware processor. The processor may be configured to convert an input analog signal to a digital signal by selectively switching each of the plurality of multi-level switches to connect the plurality of sampling capacitors to one of a first reference voltage, a second reference voltage or the power capacitor. According to an embodiment, the power capacitor may be charged with a voltage from a first capacitor from among the plurality of sampling capacitors when the processor controls a first multi-level switch to switch from the first reference voltage to the second reference voltage.

The processor may be configured to control the multi-level switch to switch from the first reference voltage to the second reference voltage via the power capacitor. The processor may be configured to control the multi-level switch to switch from the first reference voltage to the power capacitor before switching to the second reference voltage. According to another embodiment, the processor may be configured to selectively switch each of the plurality of multi-level switches based on a voltage value of the power capacitor.

Figure 5:
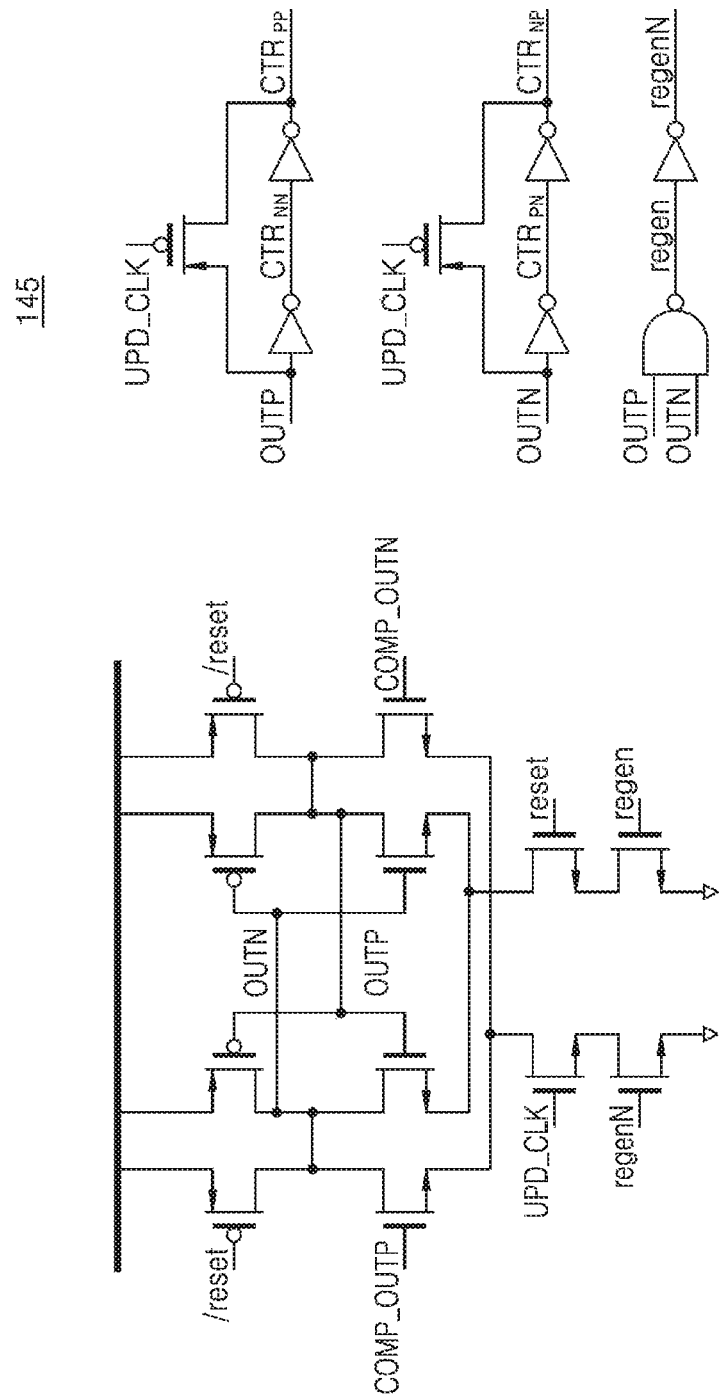
FIG. 5 is a diagram showing a register in successive approximation register (SAR) logic according to an embodiment.

FIG. 5 is a diagram showing a register in successive approximation register (SAR) logic according to an embodiment.

The SAR logic 140 may include a register 145 of FIG. 5.

The register 145 may detect a change in output signals COMP_OUTP and COMP_OUTN of the comparator 130 according to a clock signal UPD_CLK designating an operable time region and generate control signals CTRNP and CTRPP for controlling the plurality of switches 120. For example, the register 145 may detect that an output signal COMP_OUTP changes from 0 to 1 and an output signal COMP_OUTN is maintained at 0 within the operable time region designated by the clock signal UPD_CLK and consequently generate the control signals CTRNP and CTRPP.

According to an embodiment, each of the plurality of switches may include PMOS and NMOS switches and control signals CTRNP, CTRPP, CTRNN and CTRPN may be control signals for controlling the gates of the PMOS and NMOS switches. According to an embodiment, the control signals of switches connect a bottom plate of the capacitors in the capacitor array 110 in the SAR ADC of a differential structure to a reference voltage.

According to an embodiment, a dynamic latched comparator may be used as the comparator 130. When a comparator clock is disabled, regardless of the input, both ends of an output have the same voltage as VDD and VDD or GND and GND. When the comparator clock is enabled, then a decision is made on a difference of both ends of the input, and one output becomes VDD and the other output becomes GND. Accordingly, output signals COMP_OUTP and COMP_OUTN refer to the output of the dynamic latched comparator. For example, a strong-arm latch structure is one type of a dynamic latched comparator. According to an embodiment, the output of the comparator of this structure is similar to a structure in which an inverter is connected to each of out+ and out-.

The register 145 includes a relatively small number of transistors as compared with a register using a previous complementary metal-oxide semiconductor (CMOS) digital logic, and an area occupied by transistors and power consumption thereof may be reduced in SAR implementation.

For instance, in a comparative example, registers of SAR LOGIC to operate SAR ADC of a general differential mode requires as many transistors as the number of bits. However, according to an embodiment of the disclosure, the number of transistors are reduced by implementing the registers with a minimum level function to be appropriate for SAR LOGIC and a peripheral signal. For instance, the function of the minimum level is such that it operates in a particular operation (suitable for an output operation of a comparator) in which only an enable level of clock is received, and two inputs are grounded, and thereafter only one of the input becomes high, thereby reducing the number of transistors.

Moreover, since the registers of the SAR LOGIC operate through analog signal processing, instead of digital processing, the voltage change of nodes is reduced, and therefore, a low power consumption is implemented. For instance, compared to a digital operation, in which, high or low in a signal processing need to be defined, in analog operation, superimposed transistors output a result value. Accordingly, the necessary number of transistors and voltage swing of nodes between the transistors are reduced as a whole, thereby enabling low power consumption.

Figure 6:
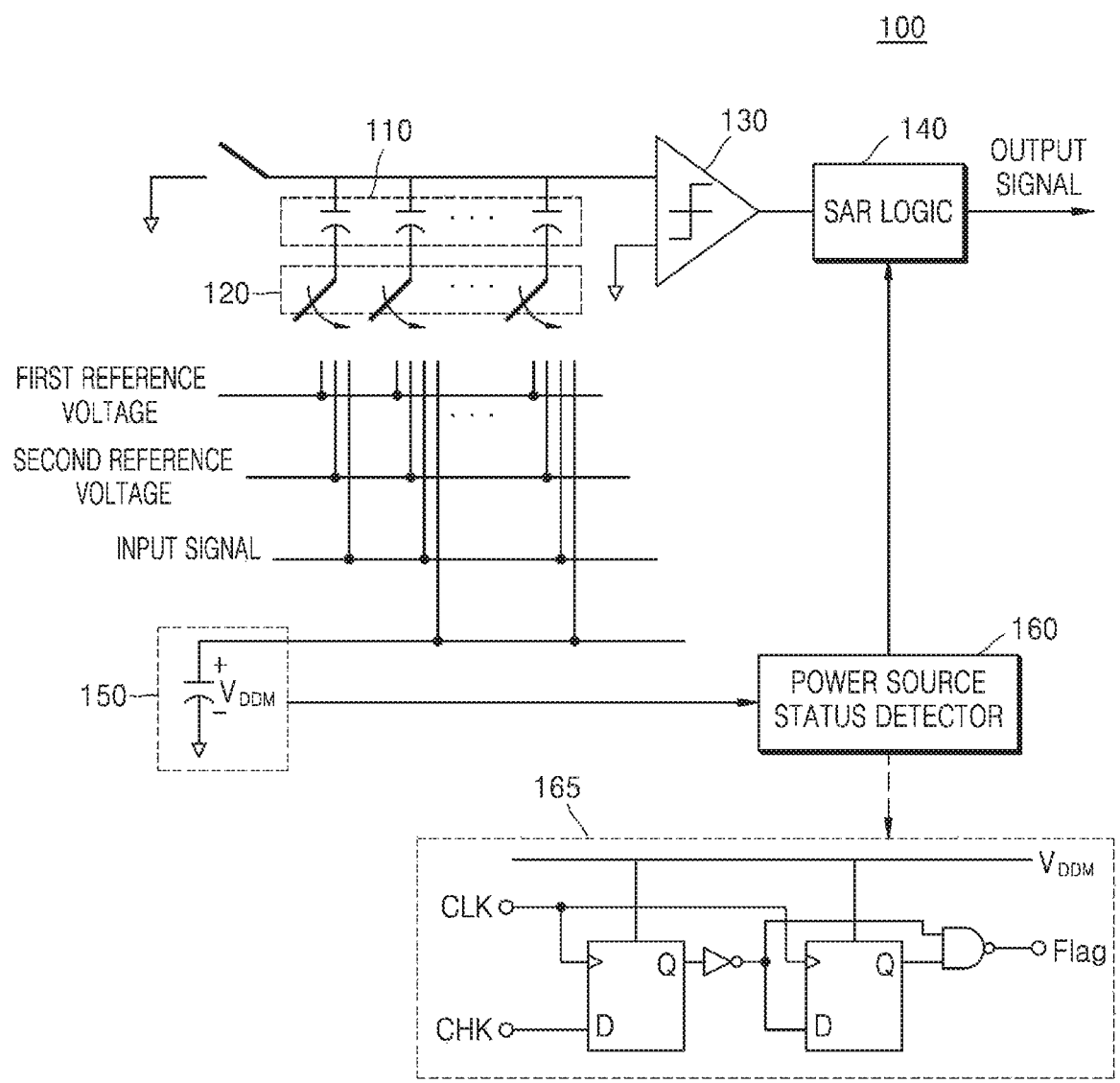
FIG. 6 is a diagram showing an analog-to-digital converter (ADC) according to another embodiment.

FIG. 6 is a diagram showing an analog-to-digital converter (ADC) according to another embodiment.

The ADC 100 may include the plurality of capacitors 110, the plurality of switches 120, the comparator 130, the SAR logic 140, and the power source capacitor 150 and may further include a power source state detector 160.

The power source status detector 160 may detect the state of the power source capacitor 150. In detail, the power source status detector 160 may determine whether the voltage of the power source capacitor 150 is equal to or higher than a pre-set threshold value. Alternatively, the power source status detector 160 may determine whether the voltage of the power source capacitor 150 is equal to or below a pre-set threshold value.

The SAR logic 140 may adjust an amount of power supplied from the power source capacitor 150 to the outside according to a result of detection by the power source status detector 160. In detail, the SAR logic 140 may control multi-level switching according to the magnitude of the voltage of the power source capacitor 150, thereby adjusting the amount of power supplied from the power source capacitor 150 to the outside.

According to an embodiment, when the voltage of the power source capacitor 150 is equal to or higher than the pre-set threshold value, the SAR logic 140 may control some of the switches capable of performing multi-level switching to perform only some of multi-level switching operations. For example, the SAR logic 140 may control some of the switches capable of performing multi-level switching to skip the storage operation of FIG. 4B. Accordingly, the voltage of the power source capacitor 150 decreases, and thus the amount of power supplied to the outside may be reduced. According to another embodiment, when the voltage of the power source capacitor 150 is equal to or below the pre-set threshold value, the SAR logic 140 may control some of the switches capable of performing multi-level switching to perform only some of the multi-level switching. For example, the SAR logic 140 may control some of the switches capable of performing multi-level switching to skip the transfer operation of FIG. 4A. Accordingly, the voltage of the power source capacitor 150 increases, and thus the amount of power supplied to the outside may be increased.

For example, the power source status detector 160 may include a circuit 165 of FIG. 6. The circuit 165 may included a D flip-flop and an inverter and may generate a flag, which is a result of comparing a voltage VDDM of the power source capacitor 150 with a pre-set threshold value, based on a clock signal CLK, a periodically generated drive signal CHK, and the voltage VDDM of the power source capacitor 150.

Figure 7:
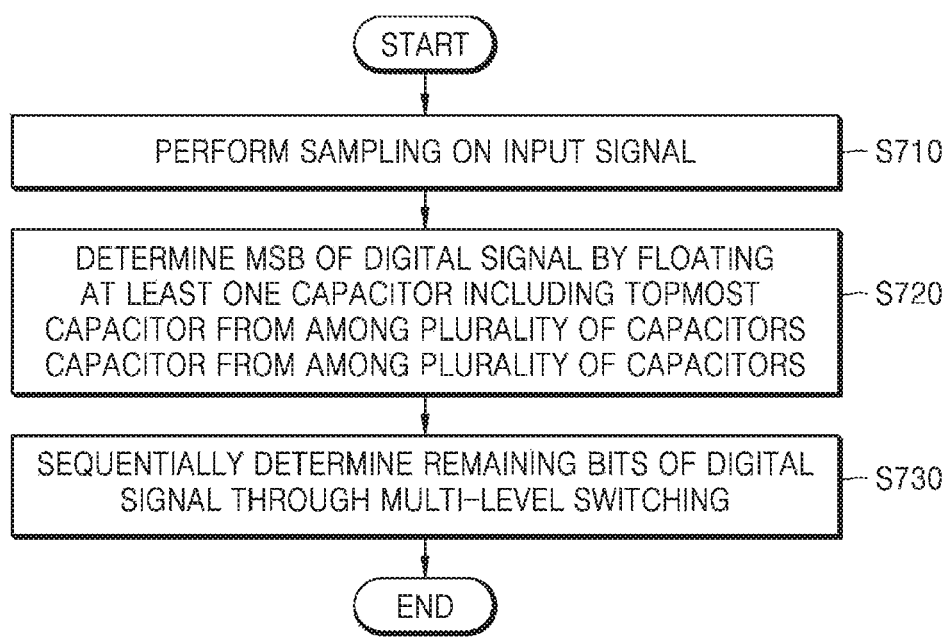
FIG. 7 is a diagram showing a method by which an ADC converts an analog signal to a digital signal.

FIG. 7 is a diagram showing a method by which an ADC converts an analog signal to a digital signal.

The method shown in FIG. 7 may be performed by the components of the ADC 100 of FIGS. 2 to 6, and descriptions identical to those given above will omitted.

In operation S710, the ADC 100 may perform sampling on an input signal. In detail, the ADC 100 may apply an input signal to each of the plurality of capacitors 110 by connecting the input signal, which is an analog signal, to each of the plurality of capacitors 110.

In operation S720, the ADC 100 may float at least one capacitor including the topmost capacitor from among the plurality of capacitors 110 and determine the MSB of a digital signal. According to an embodiment, in operation S710, each of the plurality of capacitors 110 may be connected to an input signal. Next, the ADC 100 may float at least one capacitor including the topmost capacitor and connect the remaining capacitors to a first reference voltage or a second reference voltage, thereby determining the MSB of a digital signal. According to another embodiment, in operation S710, each of the plurality of capacitors 110 may be connected to an input signal. Next, the ADC 100 may float at least one capacitor including the topmost capacitor and connect the remaining capacitors to an intermediate voltage between the first reference voltage and the second reference voltage, thereby determining the MSB of a digital signal.

Therefore, during the determination of the MSB of a digital signal, the ADC 100 does not perform switching on at least one capacitor including the topmost capacitor, thereby reducing the loss energy due to switching of the at least one capacitor.

Figure 8:
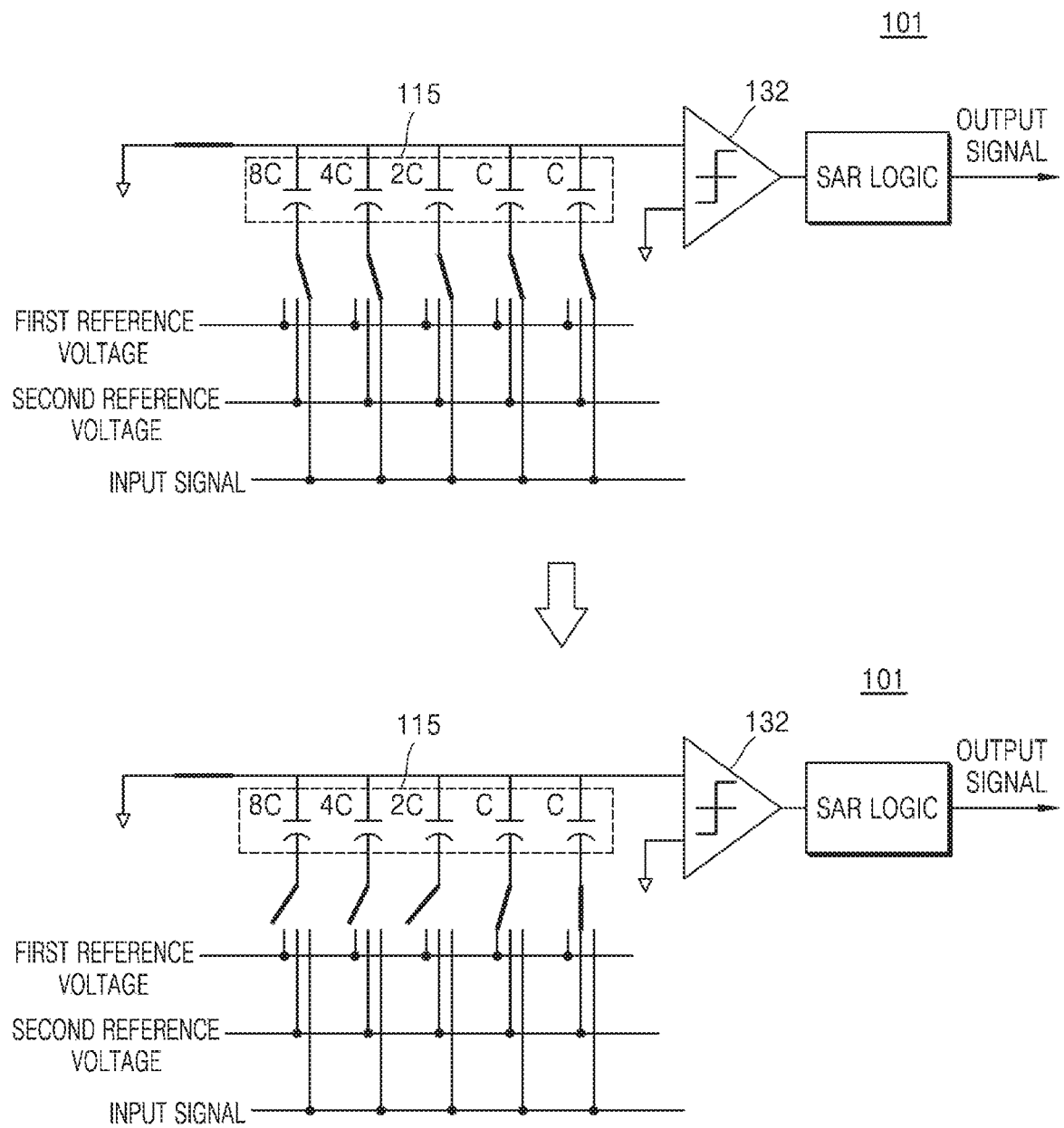
FIG. 8 is a diagram showing an embodiment in which an ADC floats at least one capacitor to determine a MSB of a digital signal.

FIG. 8 is a diagram showing an embodiment in which an ADC floats at least one capacitor to determine a MSB of a digital signal.

For convenience of explanation, FIG. 8 shows that the plurality of capacitors 115 of the ADC 101 include an 8C capacitor having a capacitance value 8C, a 4C capacitor having a capacitance value 4C, a 2C capacitor having a capacitance value 2C, and two C capacitors having a capacitance value C each. However, the disclosure is not limited thereto. For instance, according to another embodiment, the capacitance value of each capacitors may be different.

First, in the embodiment shown in the upper part of FIG. 8, the ADC 101 may perform an input signal sampling operation by connecting an input signal to each of the plurality of capacitors 115.

Next, in the embodiment shown in the lower part of FIG. 8, the ADC 101 may determine the MSB of a digital signal by floating at least one capacitor including the topmost capacitor from among the plurality of capacitors 115. In detail, the ADC 101 may float the 8C capacitor, the 4C capacitor, and the 2C capacitor from among a total of 5 capacitors and connect the first reference voltage and the second reference voltage to the remaining two capacitors. As a result, the ADC 101 may compare the half of the first reference voltage with the input signal through the comparator 132 and determine the MSB of a digital signal.

According to another embodiment, the ADC 101 may float the 8C capacitor, the 4C capacitor, and the 2C capacitor from among a total of 5 capacitors and connect the intermediate voltage between the first reference voltage and the second reference voltage to the remaining two capacitors. For example, the ADC 101 may connect an intermediate voltage of 0.5 [v] between a first reference voltage of 1 [v] and a second reference voltage of 0 [v] to the remaining two C capacitors. As a result, the ADC 101 may compare the half of the first reference voltage with the input signal through the comparator 132 and determine the MSB of a digital signal.

Referring back to FIG. 7, in operation S730, the ADC 100 may sequentially determine the remaining bits of the digital signal through multi-level switching. In other words, after determining the MSB of the digital signal in operation S720, the ADC 100 may perform multi-level switching during a switching process for determining the remaining bits of the digital signal. For example, during the process for determining the remaining bits of the digital signal, when the ADC 100 switches a voltage connected to at least one capacitor from among a plurality of capacitors from a first reference voltage to a second reference voltage, the ADC 100 may perform multi-level switching for switching from the first reference voltage to the second reference voltage via a power source capacitor.

Therefore, the ADC 100 may generate a power source by charging the voltage of the power source capacitor through multi-level switching during the process for determining the bit of the digital signal and may reduce the loss energy due to the switching. Furthermore, in operation S730, since the ADC 100 performs switching for connecting the first reference voltage or the second reference voltage to the capacitor floated in operation S720, the ADC 100 may reduce the loss energy as compared with a previous method of changing a voltage. For example, as compared with switching a voltage connected to a capacitor that determines the MSB from the first reference voltage to the second reference voltage, switching for connecting the second reference voltage while the capacitor that determines the MSB is being floated may consume less energy.

According to another embodiment, the method of converting an analog signal to a digital signal by an analog-to-digital converter may include converting an input analog signal to a digital signal by selectively switching each of a plurality of multi-level switches to connect the plurality of sampling capacitors to one of a first reference voltage, a second reference voltage or the second capacitor; and charging the power capacitor with a voltage from a first capacitor from among the plurality of sampling capacitors when a first multi-level switch is controlled to switch from the first reference voltage to the second reference voltage.

The method may include controlling the multi-level switch to switch from the first reference voltage to the second reference voltage via the power capacitor. The method may include controlling the multi-level switch to switch from the first reference voltage to the power capacitor before switching to the second reference voltage. According to an embodiment, the method may include selectively switching each of the plurality of multi-level switches based on a voltage value of the power capacitor.

Figure 9:
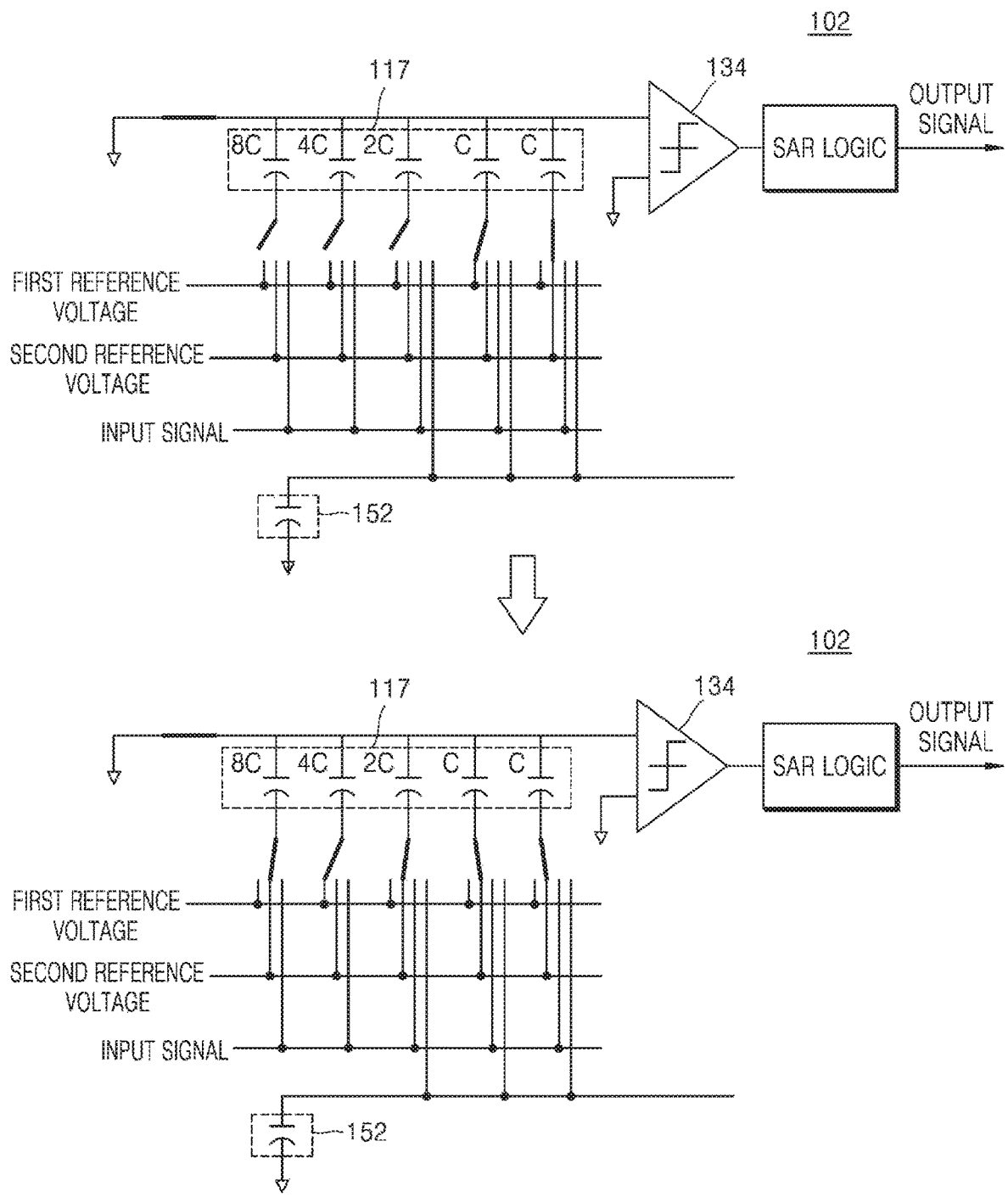
FIG. 9 is a diagram showing an embodiment in which an ADC determines bits of a digital signal through multi-level switching.

FIG. 9 is a diagram showing an embodiment in which an ADC determines bits of a digital signal through multi-level switching.

For convenience of explanation, FIG. 9 shows that a plurality of capacitors 117 of an ADC 102 include an 8C capacitor having a capacitance value 8C, a 4C capacitor having a capacitance value 4C, a 2C capacitor having a capacitance value 2C, and two C capacitors having a capacitance value C each. However, the disclosure is not limited thereto. For instance, according to another embodiment, the capacitance value of each capacitors may be different.

First, in the embodiment shown in the upper part of FIG. 9, like in FIG. 8, the ADC 102 may determine the MSB of a digital signal by floating at least one capacitor including the topmost capacitor from among the plurality of capacitors 117. In detail, the ADC 102 may float the 8C capacitor, the 4C capacitor, and the 2C capacitor from among a total of 5 capacitors and connect the first reference voltage and the second reference voltage to the remaining two capacitors.

After the ADC 102 determines the MSB of a digital signal, the ADC 102 may sequentially determine bits below the MSB. In other words, the ADC 102 may control five switches corresponding to five capacitors to sequentially determine bits below the MSB of the digital signal.

In the embodiment shown in the lower part of FIG. 9, to determine a bit next to the MSB, the ADC 102 may connect a second reference voltage to the floated 8C capacitor, connect a first reference voltage to the floated 4C capacitor, connect the second reference voltage to the floated 2C capacitor, switch a voltage connected to the capacitor C from the first reference voltage to the second reference voltage, and maintain the second reference voltage connected to the capacitor C. At this time, the ADC 102 may perform multi-level switching to switch the voltage connected to the capacitor C from the first reference voltage to the second reference voltage through the power source capacitor 152. In other words, the ADC 102 may control switches, such that one end of the capacitor C is sequentially connected to the first reference voltage, one end of the power source capacitor 152, and the second reference voltage. As a result, the ADC 102 may compare the quarter of the first reference voltage with the input signal through a comparator 134 and determine a bit next to the MSB of a digital signal.

Therefore, the ADC 102 may control a plurality of switches and perform multi-level switching until the LSB is determined. Also, the ADC 102 may adjust the number of switches for performing multi-level switching to adjust the loss energy due to the switching. Although FIG. 9 shows that switches for performing multi-level switching are switches for capacitors corresponding to the lower three bits, the disclosure is not limited thereto. For example, when the plurality of capacitors in the ADC 102 include twelve capacitors, multi-level switching may be controlled only for three capacitors next to the topmost capacitor corresponding to the MSB.

Figure 10:
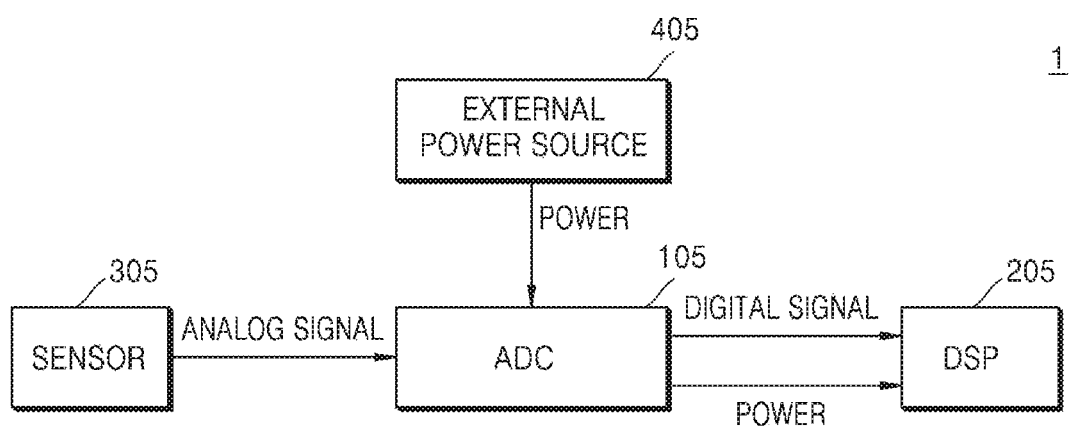
FIG. 10 is a diagram showing a sensor system according to an embodiment.

FIG. 10 is a diagram showing a sensor system according to an embodiment.

A sensor system 1 may include a sensor 305, an ADC 105, a DSP 205, and an external power source 405. The sensor system 1 shown in FIG. 10 shows only components related to the embodiment. Therefore, it will be understood by one of ordinary skill in the art that general-purpose components other than the components shown in FIG. 10 may be further included.

Since descriptions of the ADC 105 of FIG. 10 include the above-given descriptions of the ADC 100 of FIGS. 1 to 7 and the ADCs 101 and 102 of FIGS. 8 and 9, descriptions identical to those given above will be omitted. Also, since descriptions of the DSP 205 of FIG. 10 include the above-given descriptions of the DSP 200 of FIG. 1, descriptions identical to those given above will be omitted.

The sensor 305 may output an analog signal according to a result of detection. In detail, the sensor 305 may detect a physical amount or a change of heat, light, temperature, pressure, and sound of the surroundings and output an analog signal.

The external power source 405 may supply power to the ADC 105 and the ADC 105 may convert the analog signal to a digital signal based on the supplied power. The external power source 405 may include at least one of a battery or a PMIC.

The ADC 105 may generate an internal power source during conversion of an analog signal to a digital signal and may supply power to the DSP 205 through the generated internal power source. In detail, the ADC 105 may generate an internal power source by charging a capacitor with a voltage during conversion of an analog signal to a digital signal.

The DSP 205 may process digital signals output from the ADC 105. The DSP 205 may process digital signals by using power supplied from the ADC 105. The DSP 205 may process digital signals by using only power supplied from the internal power source of the ADC 105 without receiving any power from the external power source 405. Therefore, since power to be supplied to the DSP 205 from the external power source 405 is not needed, the sensor system 1 may be operated with low power, thus exhibiting low heat generation or longer expected lifespan.

Also, since the DSP 205 may be operated only with power supplied by the ADC 105 and does not need an external power source such as a PMIC for supplying power to the DSP 205, the area or the volume occupied by the sensor system 1 may be reduced. Therefore, the sensor system 1 may be miniaturized, and thus may be employed in micro devices. For example, the sensor system 1 may be employed in an Internet of Things (IoT) micro device such as a micro temperature sensor, a micro humidity sensor, or a micro distance sensor, may be employed in a micro wearable device such as a hearing aid or a retina display, or may be employed in an implantable sensor that senses brain waves or biological signals. However, the disclosure is not limited thereto.

Each of the sensor 305, the ADC 105, the DSP 205, and the external power source 405 in the sensor system 1 of FIG. 10 may exist in plural. For example, when the sensor system 1 is a multi-channel high-quality acoustic sensor system or a multi-channel high-quality visual sensor system, the sensor system 1 may include sensors, ADCs, DSPs, or external power sources for multiple channels.

Figure 11:
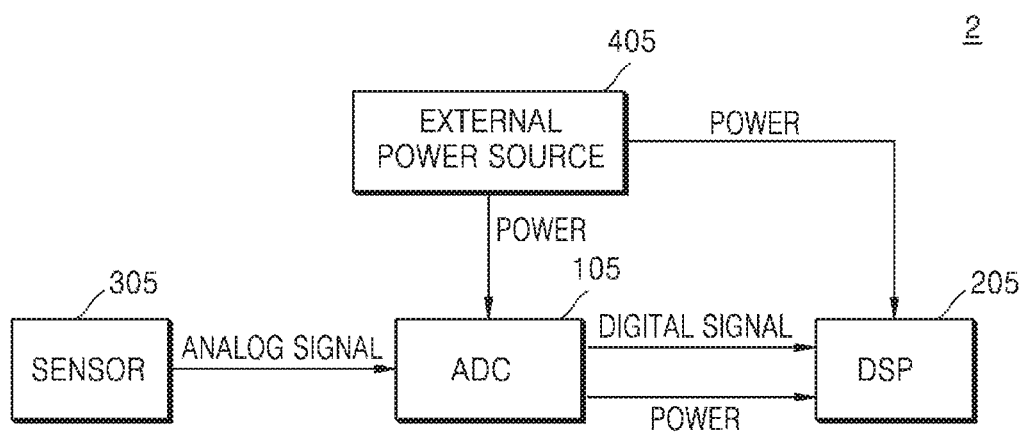
FIG. 11 is a diagram showing a sensor system according to another embodiment.

FIG. 11 is a diagram showing a sensor system according to another embodiment.

A sensor system 2 may include the sensor 305, the ADC 105, the DSP 205, and the external power source 405. The sensor system 2 shown in FIG. 11 shows only components related to the embodiment. Therefore, it will be understood by one of ordinary skill in the art that general-purpose components other than the components shown in FIG. 11 may be further included.

Since descriptions of the sensor 305, the ADC 105, the DSP 205, and the external power source 405 of FIG. 11 includes the above-given descriptions of the sensor 305, the ADC 105, the DSP 205, and the external power source 405 of FIG. 10, descriptions identical to those given above will be omitted.

The DSP 205 may receive power from the external power source 405 and may also receive power from the ADC 105. The DSP 205 may process a digital signal by using the power supplied from the ADC 105 and the external power source 405.

According to an embodiment, the DSP 205 may operate in a low power always-on mode by using the power supplied from the ADC 105 and perform additional calculations and operations by using the power supplied from the external power source 405. According to another embodiment, the DSP 205 may perform data suppression for digital signals output from the ADC 105 by using the power supplied from the ADC 105 and perform additional calculations and operations by using the power supplied from the external power source 405.

Figure 12:
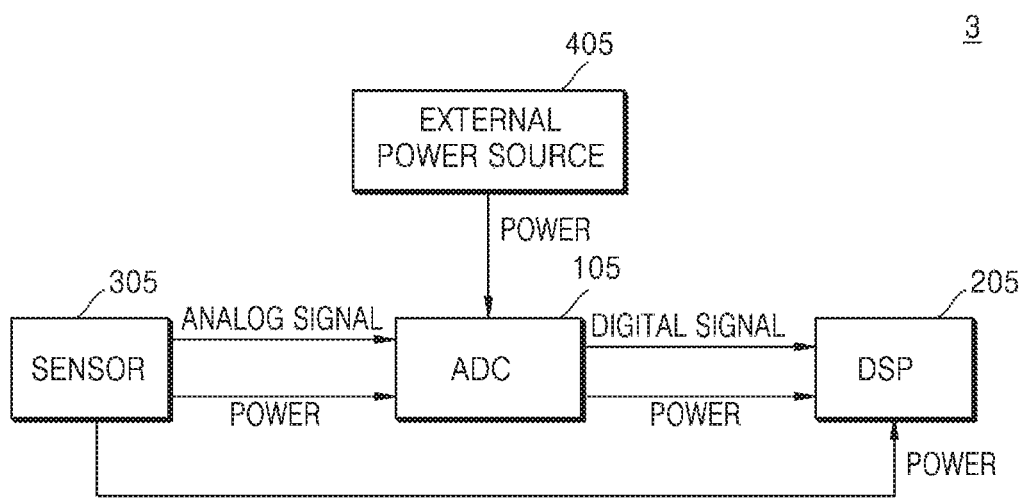
FIG. 12 is a diagram showing a sensor system according to another embodiment.

FIG. 12 is a diagram showing a sensor system according to another embodiment.

A sensor system 3 may include the sensor 305, the ADC 105, the DSP 205, and the external power source 405. The sensor system 3 shown in FIG. 12 shows only components related to the embodiment. Therefore, it will be understood by one of ordinary skill in the art that general-purpose components other than the components shown in FIG. 12 may be further included.

Since descriptions of the sensor 305, the ADC 105, the DSP 205, and the external power source 405 of FIG. 12 includes the above-given descriptions of the sensor 305, the ADC 105, the DSP 205, and the external power source 405 of FIG. 10, descriptions identical to those given above will be omitted.

The sensor 305 may supply power to the ADC 105. Furthermore, the sensor 305 may supply power to the DSP 205. According to an embodiment, when the sensor 305 is a piezoelectric sensor, the sensor 305 may generate power according to a vibration, and thus the sensor 305 may supply power to the ADC 105 or the DSP 205. According to another embodiment, when the sensor 305 is a sensor that may be inserted into a human body, the sensor 305 may generate power in accordance with heat conduction, and thus the sensor 305 may supply power to the ADC 105 or the DSP 205. According to another embodiment, when the sensor 305 is a sensor for detecting wind power, the sensor 305 may generate power by using wind power, and thus the sensor 305 may supply power to the ADC 105 or the DSP 205.

Therefore, the ADC 105 may convert an analog signal to a digital signal by using the power supplied from the external power source 405 and the power supplied from the sensor 305. Furthermore, the DSP 205 may process a digital signal by using the power supplied from the ADC 105 and the sensor 305.

According to the above embodiments, since an ADC generates a power source during a process for converting an analog signal into a digital signal and supplies power to a DSP through the power source, an integrated circuit or a sensor system with lower power consumption may be implemented. Also, since the DSP may be operated only with power supplied by the ADC and does not need an external power source such as a power management integrated circuit (PMIC) for supplying power to the DSP 200, the integrated circuit and the sensor system may be employed in micro devices.

Also, according to the above embodiments, the ADC may reduce loss energy due to switching by realizing multi-level switching, and area occupied by transistors and the power consumption thereof may be reduced by implementing a SAR through a register structure in a SAR logic.

A integrated circuit or a sensor system according to the above embodiments may include a processor, a memory for storing and executing program data, a permanent storage such as a disk drive, a communication port for communicating with an external device, a touch panel, key, buttons, and the like. Methods implemented with software modules or algorithms may be stored on a computer-readable recording medium as computer-readable codes or program instructions executable on the processor. Here, the computer-readable recording medium may include a magnetic storage medium (e.g., a read-only memory (ROM), a random-access memory (RAM), a floppy disk, a hard disk, etc.), an optical readable medium (e.g., a CD-ROM, a digital versatile disc (DVD), etc.), etc. The computer-readable recording medium may be distributed over networked computer systems so that computer-readable codes may be stored and executed in a distributed manner. The medium may be read by a computer, stored in a memory, and executed on a processor.

Some embodiments may be described in terms of functional block components and various processing steps. Such functional blocks may be realized by any number of hardware and/or software components configured to perform the specified functions. For example, the disclosure may employ various integrated circuit (IC) components, e.g., memory elements, processing elements, logic elements, look-up tables, and the like, which may carry out a variety of functions under the control of one or more microprocessors or other control devices. Similarly, where the elements of the disclosure are implemented using software programming or software elements, the invention may be implemented with any programming or scripting language such as C, C++, Java, assembler, or the like, with the various algorithms being implemented with any combination of data structures, objects, processes, routines or other programming elements. Functional aspects may be implemented in algorithms that are executed on one or more processors. Furthermore, the disclosure could employ any number of conventional techniques for electronics configuration, signal processing and/or control, data processing and the like. The words "mechanism", "element", "means", and "configuration" are used broadly and are not limited to mechanical or physical embodiments, but can include software routines in conjunction with processors, etc.

The particular implementations shown and described herein are illustrative examples of the invention and are not intended to otherwise limit the scope of the invention in any way. For the sake of brevity, conventional electronics, control systems, software development and other functional aspects of the systems may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device.

The use of the terms "a" and "an" and "the" and similar referents in the context of describing the invention (especially in the context of the following claims) are to be construed to cover both the singular and the plural. Furthermore, recitation of ranges of values herein are merely intended to serve as a shorthand method of referring individually to each separate value falling within the range, unless otherwise indicated herein, and each separate value is incorporated into the specification as if it were individually recited herein. Also, the operations or steps of all methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. Numerous modifications and adaptations will be readily apparent to one of ordinary skill in the art without departing from the spirit and scope of the disclosure.

What is claimed is:

1. An integrated circuit comprising:
    a digital signal processor (DSP) configured to process a digital signal; and
    an analog-to-digital converter (ADC) configured to:
        convert an analog signal to the digital signal;
        generate a power source during a process of converting the analog signal into the digital signal; and
        supply power to the DSP based on the power source.

2. The integrated circuit of claim 1, wherein the ADC is further configured to generate the power source by charging a power source capacitor during the process of converting the analog signal into the digital signal.

3. The integrated circuit of claim 1, wherein the ADC is further configured to:
    determine bits of the digital signal by switching a voltage connected to at least one capacitor from among a plurality of capacitors from a first reference voltage to a second reference voltage,
    perform multi-level switching of the at least one capacitor for switching the voltage from the first reference voltage to the second reference voltage through the power source capacitor, and
    generate the power source by charging a voltage to a power source capacitor through the multi-level switching.

4. The integrated circuit of claim 3, wherein the at least one capacitor is different from a topmost capacitor from among the plurality of capacitors arranged in a sequence.

5. The integrated circuit of claim 3, wherein the ADC is further configured to control the multi-level switching according to a magnitude of a voltage of the power source capacitor and adjust an amount of power supplied to the DSP.

6. The integrated circuit of claim 1, wherein the ADC is further configured to convert the analog signal to the digital signal based on power supplied from an external power source, and
    the DSP is further configured to process the digital signal based on power supplied from the power source generated by the ADC without receiving power from the external power source.

7. An analog-to-digital converter (ADC) for converting an analog signal to a digital signal, the ADC comprising:
    a plurality of capacitors;

a plurality of switches; and
successive approximation register (SAR) logic configured to:
sample the analog signal by connecting the analog signal to the plurality of capacitors;
float at least one capacitor comprising a topmost capacitor from among the plurality of capacitors arranged in a sequence, to determine a most significant bit (MSB) of the digital signal;
switch voltages connected to the plurality of capacitors through the plurality of switches and determine bits other than the MSB of the digital signal.

8. The ADC of claim 7, wherein the SAR logic is further configured to determine the MSB of the digital signal by floating the at least one capacitor and connect a first reference voltage or a second reference voltage to one or more capacitors other than the at least one capacitor from among the plurality of capacitors.

9. The ADC of claim 8, wherein the SAR logic is further configured to determine the MSB of the digital signal by floating the at least one capacitor and connect an intermediate voltage to one or more capacitors other than the at least one capacitor from among the plurality of capacitors, the intermediate voltage having a voltage value between the first reference voltage and the second reference voltage.

10. The ADC of claim 8, further comprising a power source capacitor,
wherein, when a voltage connected to at least one capacitor from among the plurality of capacitors is switched from the first reference voltage to the second reference voltage, the SAR logic is further configured to perform multi-level switching for switching the voltage from the first reference voltage to the second reference voltage through the power source capacitor.

11. The ADC of claim 10, wherein the SAR logic is further configured to generate a power source by charging a voltage to the power source capacitor through the multi-level switching and supply power to a digital signal processor (DSP) through the power source.

12. The ADC of claim 11, further comprising a power source status detector configured to determine whether the voltage of the power source capacitor is higher than or equal to a threshold value or is below the threshold value,
wherein the SAR logic is further configured to control the multi-level switching according to a result of the determination and adjust an amount of power supplied to the DSP.

13. The ADC of claim 7, wherein the SAR logic is further configured to detect a change in an output signal of a comparator according to a clock signal designating an operable time region and generate a control signal for controlling the plurality of switches based on the detected change in the output signal of the comparator.

14. A sensor system comprising:
a sensor;
an external power source;
a digital signal processor (DSP) configured to process the digital signal;
an analog-to-digital converter (ADC) configured to:
convert an analog signal detected by the sensor into the digital signal based on a power supplied from the external power source;
generate an internal power source during a process of converting the analog signal into the digital signal, and
supply power to the DSP based on the internal power source.

15. The sensor system of claim 14, wherein the ADC is further configured to receive power from an external power source, and
the DSP is further configured to process the digital signal based on power supplied from the internal power source generated by the ADC without receiving power from the external power source.

16. The sensor system of claim 14, wherein the DSP is further configured to receive power from the external power source and process the digital signal based on power supplied from the ADC and the external power source.

17. The sensor system of claim 14, wherein the ADC is further configured to receive power from the sensor and convert the analog signal to the digital signal based on the power supplied from the sensor and the power supplied from the external power source.

18. The sensor system of claim 14, wherein the DSP is further configured to receive power from the sensor and process the digital signal based on the power supplied from the ADC and the power supplied from the sensor.

19. An analog-to-digital converter (ADC) comprising:
a plurality of sampling capacitors;
a plurality of multi-level switches, each comprising a first end connected one of the plurality of sampling capacitors;
a power capacitor; and
a processor configured to convert an input analog signal to a digital signal by selectively switching each of the plurality of multi-level switches to connect the plurality of sampling capacitors to one of a first reference voltage, a second reference voltage or the power capacitor,
wherein the power capacitor is charged with a voltage from a first capacitor from among the plurality of sampling capacitors when the processor controls a first multi-level switch to switch from the first reference voltage to the second reference voltage.

20. The ADC of claim 19, wherein the processor is further configured to control the multi-level switch to switch from the first reference voltage to the second reference voltage via the power capacitor.

21. The ADC of claim 19, wherein the processor is further configured to control the multi-level switch to switch from the first reference voltage to the power capacitor before switching to the second reference voltage.

22. The ADC of claim 19, wherein the processor is further configured to selectively switch each of the plurality of multi-level switches based on a voltage value of the power capacitor.

23. A method of converting an analog signal to a digital signal by an analog-to-digital converter (ADC) comprising a plurality of sampling capacitors, a plurality of multi-level switches, each comprising a first end connected one of the plurality of sampling capacitors and a power capacitor, the method comprising:
converting an input analog signal to a digital signal by selectively switching each of the plurality of multi-level switches to connect the plurality of sampling capacitors to one of a first reference voltage, a second reference voltage or the second capacitor; and
charging the power capacitor with a voltage from a first capacitor from among the plurality of sampling capacitors when a first multi-level switch is controlled to switch from the first reference voltage to the second reference voltage.

24. The method of claim 23, further comprises controlling the multi-level switch to switch from the first reference voltage to the second reference voltage via the power capacitor.

25. The method of claim 23, further comprises controlling the multi-level switch to switch from the first reference voltage to the power capacitor before switching to the second reference voltage.

26. The method of claim 23, further comprises selectively switching each of the plurality of multi-level switches based on a voltage value of the power capacitor.

27. The integrated circuit of claim 1, wherein the ADC is further configured to separately provide the digital signal and the power to the DSP.

28. The integrated circuit of claim 1, wherein the ADC is further configured to provide the digital signal and the power via different signal lines.

\* \* \* \* \*